United States Patent [19]
Kim et al.

[11] Patent Number: 6,006,424
[45] Date of Patent: Dec. 28, 1999

[54] METHOD FOR FABRICATING INNER LEADS OF A FINE PITCH LEADFRAME

[75] Inventors: Yong-yeon Kim; Tai-yong Ahn, both of Korea, Rep. of Korea

[73] Assignee: Samsung Aerospace Industries, Ltd., Suwon, Rep. of Korea

[21] Appl. No.: 09/075,948

[22] Filed: May 12, 1998

[30] Foreign Application Priority Data

May 12, 1997 [KR] Rep. of Korea .................. 97-18331

[51] Int. Cl.⁶ ............................................. H01R 43/00
[52] U.S. Cl. ............................ 29/827; 29/830; 29/852
[58] Field of Search ............................. 29/852, 827, 830

[56] References Cited

U.S. PATENT DOCUMENTS

| 5,327,008 | 7/1994 | Djennas et al. ............... 29/827 X |
| 5,394,607 | 3/1995 | Chiu et al. ...................... 29/827 |
| 5,406,700 | 4/1995 | Ito ................................... 29/827 |
| 5,429,992 | 7/1995 | Abbott et al. .................. 29/827 |
| 5,454,905 | 10/1995 | Fogelson ........................ 29/827 |

*Primary Examiner*—Carl J. Arbes
*Attorney, Agent, or Firm*—Howrey & Simon

[57] ABSTRACT

A method of fabricating the inner leads of a fine pitch leadframe having a small interval between leads. The inner leads of the fine pitch leadframe are fabricated by combining a new stamping tool for fabricating extended fine pitch portions of inner leads with an existing stamping tool for fabricating the inner leads of a leadframe. This method obviates the time and expense of manufacturing an entirely new stamping tool.

4 Claims, 3 Drawing Sheets

METHOD FOR FABRICATING INNER LEADS OF A FINE PITCH LEADFRAME

BACKGROUND OF THE INVENTION

1. Field of the Invention

The present invention relates to a method of fabricating a leadframe used in a semiconductor assembly process, and more particularly, to a method of fabricating a leadframe with inner leads having a fine pitch.

2. Description of the Related Art

A lead frame is an essential component of a semiconductor package because it connects the package to external devices and supports a semiconductor chip. The lead frame includes a chip pad for mounting a chip, an inner lead, and an external lead. There are two currently-known lead frame manufacturing methods, a stamping method and an etching method. In a stamping method, a sequential transfer-type molding machine transfers a lead frame material sequentially and presses it to manufacture a product in a predetermined shape. This method is usually employed in the mass production. In an etching method, a lead frame material is coated with a photoresist and undergoes photolithography, whereby a lead frame is manufactured by a chemical etch reaction. The etching is generally used during the initial development of a lead frame with a fine pattern. With the recent reduction in semiconductor chip size, a lead frame fabrication technique has been developed to achieve a lead frame with a finer pattern. For a lead frame fabricated by the stamping method, if the chip size is reduced, the lead frame design should be changed. Specifically, the chip pad size must be reduced and the interval between inner leads must be reduced, which results in a lead frame having a fine pitch.

In order to fabricate such a fine pitch type lead frame, known fabrication methods have required a new stamping tool punch for a stamping tool in order to fabricate the inner leads. Undesirable amounts of time and money are required to design and fabricate such a stamping tool punch.

SUMMARY OF THE INVENTION

To solve the above-mentioned drawbacks, it is an object of the present invention to provide a method of fabricating inner leads of a fine pitch lead frame, which reduces manufacturing time and costs by employing an existing stamping tool punch used in previous lead frame fabrication.

In order to achieve this object, one embodiment of the present invention provides a method for fabricating the inner leads of a fine pitch leadframe including the steps of manufacturing a first stamping tool punch for pressing fine pitch inner leads; fabricating the extended fine pitch inner leads using the first stamping tool punch; and fabricating the remainder of the inner leads using an existing, second stamping tool punch.

A second embodiment of the present invention provides a method for fabricating the inner leads of a fine pitch leadframe including the steps of manufacturing a first stamping tool punch for pressing fine pitch inner leads; fabricating portions of the inner leads other than the extended fine pitch inner leads using an existing, second stamping tool punch; and fabricating the extended fine pitch inner leads using the first stamping tool punch. According to the preferred embodiments, a stamping tool punch modified to prevent cutting off the end portion of the inner lead contacting the extended fine pitch inner lead is employed.

BRIEF DESCRIPTION OF THE DRAWINGS

The above object and advantages of the present invention will become more apparent through a description of a preferred embodiment thereof with reference to the attached drawings in which.

DESCRIPTION OF THE PREFERRED EMBODIMENTS

Figure 1:
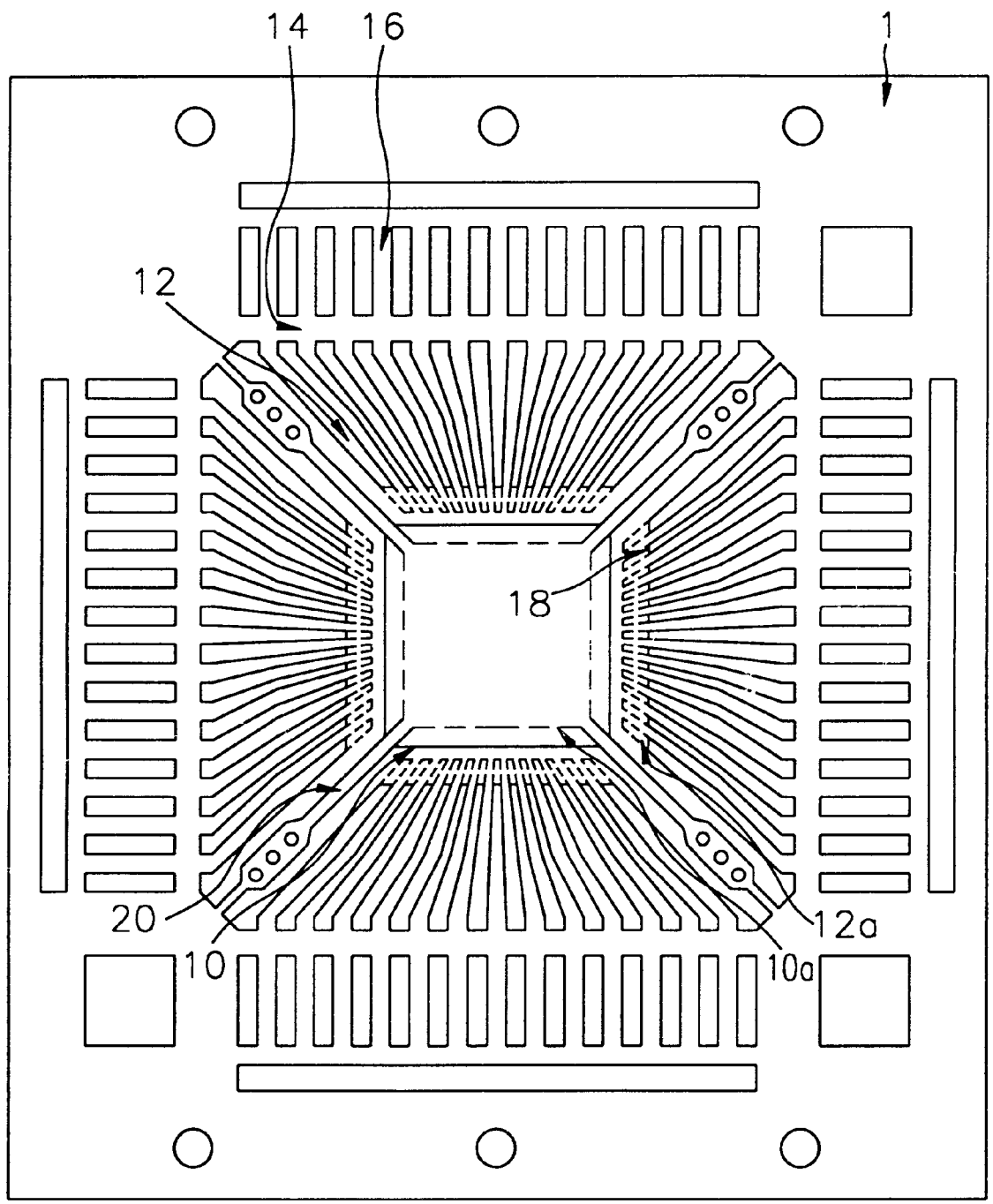
FIG. 1 illustrates a leadframe fabricated according to an embodiment of the present invention.

Referring to FIG. 1, a 68 pin plastic leaded chip carrier (PLCC) package, a chip pad 10 for mounting a chip, and an inner lead 12 are formed on a leadframe material containing copper (Cu), nickel (Ni), and iron (Fe). The inner lead 12 is connected to an outer lead 16 via a damber line 14, and the chip pad 10 is connected to a main body 1 of the leadframe material by a tie bar 20.

When the chip size is reduced, the size of the chip pad 10 needs to be reduced to shape 10a and the inner leads need to be extended to form fine pitch inner leads 12a with a smaller interval therebetween. The reduced chip pad 10a and the extended fine pitch inner leads 12a are shown by dotted lines in FIG. 1.

Figure 2:
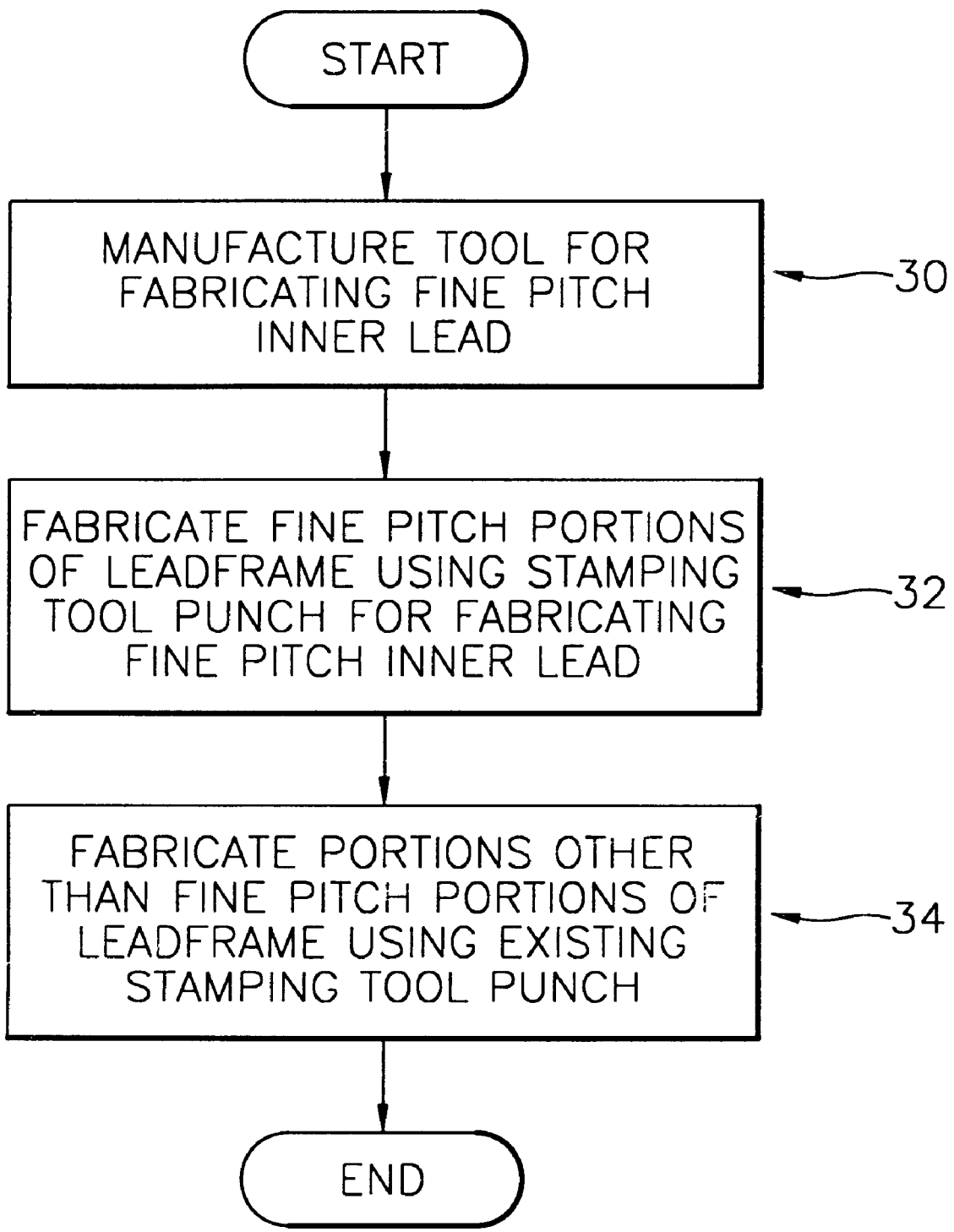
FIG. 2 is a flowchart illustrating a method for fabricating an inner lead of a fine pitch leadframe according to a first embodiment of the present invention.

FIG. 2 is a flowchart illustrating a method for fabricating an inner lead of a fine pitch leadframe according to a first embodiment of the present invention. First, a stamping mold for fabricating the extended portion (12a) of the fine pitch inner lead is manufactured to connect to a stamping tool for fabricating existing inner leads. (Step 30 of FIG. 2) The stamping tool for fabricating the existing inner leads is adjusted to accommodate the new stamping mold manufactured in step 30. This saves development time for the new stamping tool and manufacturing costs for the leadframe. Next, the extended fine pitch inner lead 12a is fabricated using the new stamping tool punch. (Step 32) Parts other than the fine pitch portion of the leadframe material are not pressed, and only the extended fine pitch inner lead 12a is formed. Finally, the inner lead 12, which was not fabricated in step 32, is manufactured using the existing stamping tool punch. (Step 34) This completes the fabrication of the fine pitch inner lead according to the present invention. Here, the existing stamping tool punch must be modified to prevent the existing inner leads 12 from being cut at their ends 18.

Figure 3:
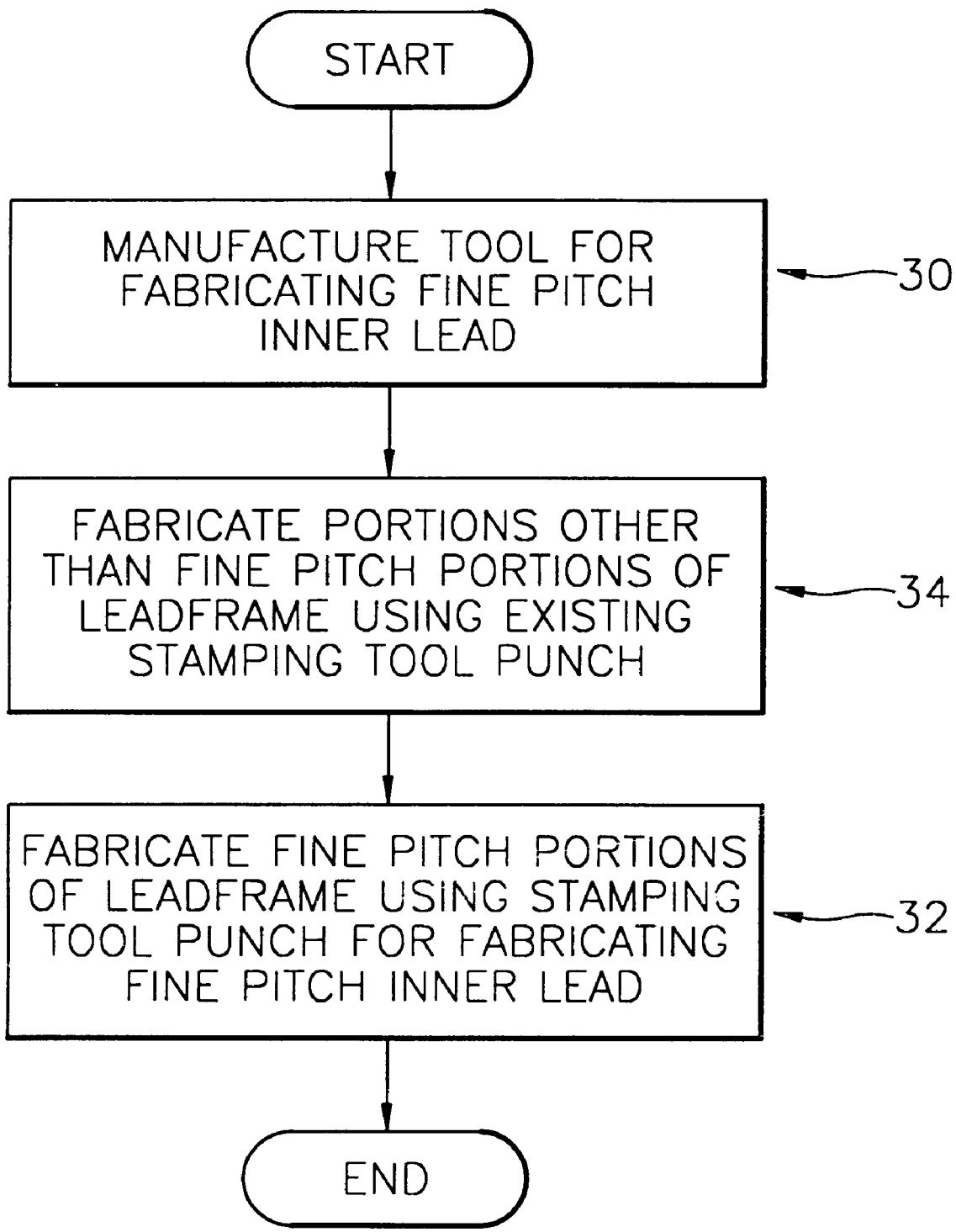
FIG. 3 is a flowchart illustrating a method for fabricating an inner lead of a fine pitch leadframe according to a second embodiment of the present invention.

FIG. 3 is a flowchart illustrating a method for fabricating an inner lead of a fine pitch leadframe according to a second embodiment of the present invention. In the second embodiment, the fabrication is performed by reversing the order of the second and third steps of the first embodiment. That is, a stamping tool punch for pressing the extended fine pitch inner lead that cannot be fabricated with an existing stamping tool punch, is manufactured and connected to the existing stamping tool. (Step 30 of FIG. 3) Then, the lead frame inner lead 12 is formed using the existing stamping tool. (Step 34 of FIG. 3) Here, the existing tool is modified to prevent the inner lead from being cut at its end 18. Next, the extended fine pitch inner lead 12a is formed using a stamping tool punch for pressing the extended fine pitch inner lead, which is not included in the existing stamping tool punch. (Step 32 of FIG. 3)

In the present invention, each of the new stamping tool punch and the existing one are installed into separate stamping tools which operate sequentially while the leadframe material moves at a constant speed.

According to the present invention described above, the inner lead of the fine pitch leadframe is fabricated by combining the existing stamping tool punch with the new stamping tool punch for pressing the extended fine pitch inner lead. Thus, time and costs for developing a new stamping tool punch can be reduced.

The present invention is not limited to the aforementioned embodiments, and it is apparent that various modifications within the scope of the present invention may be effected by those skilled in the art.

We claim:

1. A method for fabricating inner leads of a fine pitch leadframe, wherein said method uses an existing stamping tool having a first stamping tool punch that has been used for existing inner leads, in fabricating fine pitch inner leads that extend toward a chip pad area as a chip mounted thereon shrinks, comprising the steps of:

(a) manufacturing a second stamping tool punch for pressing the fine pitch inner leads;

(b) fabricating the extended fine pitch inner leads using the second stamping tool punch; and (c) fabricating the remainder of the inner leads using the first stamping tool punch.

2. A method for fabricating inner leads of a fine pitch leadframe as recited in claim 1, wherein the first stamping tool punch is modified to prevent cutting a connection between the inner leads and the extended fine pitch inner leads.

3. A method for fabricating inner leads of a fine pitch leadframe, wherein said method uses an existing stamping tool having a first stamping tool punch that has been used for existing inner leads, in fabricating fine pitch inner leads that extend toward a chip pad area as a chip mounted thereon shrinks, comprising the steps of:

(a) manufacturing a second stamping tool punch for pressing the fine pitch inner leads;

(b) fabricating portions of the inner leads other than the extended fine pitch inner leads using the first stamping tool punch; and (c) fabricating the extended fine pitch inner leads using the second stamping tool punch.

4. A method for fabricating the inner leads of a fine pitch leadframe as claimed in claim 3, wherein the first stamping tool punch is modified to prevent cutting a connection between the inner leads and the extended fine pitch inner leads.

* * * * *